United States Patent [19]

Akamatsu et al.

[11] 3,895,949

[45] July 22, 1975

[54] PHOTOSENSITIVE ELEMENT COMPRISING PHOTOPOLYMERIZABLE LAYER AND PROTECTIVE LAYER

[75] Inventors: Kiyoshi Akamatsu, Tokyo; Yuzo Yokota, Doimachi; Hiroshi Sagami, Shiki; Isao Imai, Niiza, all of Japan Japan

[73] Assignee: Asahi Kasei Kogyo Kabushiki Kaisha, Osaka, Japan

[22] Filed: July 17, 1973

[21] Appl. No.: 380,018

[30] Foreign Application Priority Data

July 24, 1972 Japan .............................. 47-73976

[52] U.S. Cl. ...................... 96/86 P; 96/33; 96/36.4; 96/67; 96/68; 96/87 R; 96/115 P; 96/115 R

[51] Int. Cl. .......................... G03c 1/68; G03c 1/70

[58] Field of Search .................... 96/67, 115 P, 86 P

[56] References Cited

UNITED STATES PATENTS

| | | | |
|---|---|---|---|
| 3,113,867 | 12/1963 | Van Norman et al. | 96/67 |
| 3,458,311 | 7/1969 | Alles | 96/35.1 |
| 3,591,379 | 7/1971 | Plakunov | 96/67 |
| 3,796,578 | 3/1974 | Hosoi et al. | 96/67 |

*Primary Examiner*—Ronald H. Smith
*Attorney, Agent, or Firm*—Burgess, Dinklage & Sprung

[57] ABSTRACT

A photosensitive element comprising, in order, 1. a support,
2. a layer of a photosensitive material and
3. a protective layer having a thickness of about 0.5 to 20 microns, said protective layer being transparent to actinic radiation, substantially impermeable to oxygen, insoluble to water, non-strippable as an unsupported film and composed of a copolymer having a degree of polymerization of about 100 to 1,000 and being obtained by reaction between
   a. about 10 to 70 percent by weight of an unsaturated carboxylic acid selected from the group consisting of acrylic acid, methacrylic acid and itaconic acid and
   b. a mixture of ethylenically unsaturated compounds, said mixture comprising (i) up to about 40 percent by weight of at least one ethylenically unsaturated compound, as a hard component, selected from the group consisting of styrene, alpha-methylstyrene, methyl methacrylate, acrylonitrile and methacrylonitrile and (ii) about 50 to 30 percent by weight of at least one ethylenically unsaturated compound, as a soft component, selected from the group consisting of methyl acrylate, ethyl acrylate, n-propyl acrylate, n-butyl acrylate, 2-ethylhexyl acrylate and n-octyl methacrylate.

9 Claims, No Drawings

PHOTOSENSITIVE ELEMENT COMPRISING PHOTOPOLYMERIZABLE LAYER AND PROTECTIVE LAYER

BACKGROUND OF THE INVENTION

This invention relates to photosensitive elements useful for making printing plates.

Photosensitive materials now available include azo type resins, azide type resins and vinyl type resins and, after photopolymerization or photodegradation, are developed with water, an organic solvent or an aqueous solution of a salt. The solubility of the photosensitive material to a developer before photoreaction differs from that after photoreaction. In general, a photosensitive material of negative-positive type becomes insoluble to a developer after photoreaction while that of positive-negative type becomes soluble to a developer. In any way the hydrophilicity of photosensitive material or the solubility of photosensitive material to a developer reverses before and after photoreaction. Accordingly, when moisture, water, various chemicals or finger prints adhere to the layer of photosensitive material during storage or handling, the efficiency of the photosensitive material is reduced or the surface of the layer of photosensitive material may be easily scratched. These disadvantages cause troubles in the preparation of electric circuit printings and printing plates using such a photosensitive material.

Methods of improving these disadvantages are already available. U.S. Pat. No. 3,136,637 describes presensitized lithographic sheets with an overcoating of a hydrophobic, water-insoluble, solvent-softenable resinous polymer and according to this method the coating, after exposure, partially adheres to the exposed portions of the sensitized layer and the coating of the unexposed portions is removed by softly rubbing during development. It is accordingly possible that the overcoating of the exposed portions adjacent to that of the unexposed portions is peeled off, which renders the boundary between the exposed and unexposed portions indistinct. Furthermore, as the whole surface of the sensitized layer is covered with a hydrophobic, water-insoluble coating, it is difficult to employ an aqueous solution as a developer. U.S. Pat. No. 3,458,311 describes photopolymerizable elements with a protective stratum which is non-strippable as an unsupported film, substantially impermeable to oxygen and water-permeable and such a protective stratum is washed out together with the unexposed portions of a photopolymerizable stratum during development. However, it is very difficult to prevent the photopolymerizable stratum from degenerating during storage due to moisture or water. Additionally, the protective stratum remaining on the image areas after development disadvantageously affects the subsequent precesses.

THE INVENTION

In accordance with this invention, there is provided a photosensitive element comprising, in order, 1. a support,
2. a layer of a photosensitive material and
3. a protective layer having a thickness of about 0.5 to 20 microns, said protective layer being transparent to actinic radiation, substantially impermeable to oxygen, insoluble to water, non-strippable as an unsupported film and composed of a copolymer having a degree of polymerization of about 100 to 1,000 and being obtained by reaction between
   a. about 10 to 70 percent by weight of an unsaturated carboxylic acid selected from the group consisting of acrylic acid, methacrylic acid and itaconic acid and
   b. a mixture of ethylenically unsaturated compounds, said mixture comprising (i) up to about 40 percent by weight of at least one ethylenically unsaturated compound, as a hard component, selected from the group consisting of styrene, alpha-methylstyrene, methyl methacrylate, acrylonitrile and methacrylonitrile and (ii) about 50 to 30 percent by weight of at least one ethylenically unsaturated compound, as a soft component, selected from the group consisting of methyl acrylate, ethyl acrylate, n-propyl acrylate, n-butyl acrylate, 2-ethylhexyl acrylate and n-octyl methacrylate.

By this invention the tendency of a protective layer to adhere to interleaving paper and an image-bearing transparency can be eleminated, and the protective layer is especially insensitive to humidity and temperature changes and oxygen-impermeable.

Examples of suitable copolymers having the characteristics given above include acrylic acid / n-butyl acrylate copolymer, methacrylic acid / n-butyl acrylate copolymer, acrylic acid / styrene / n-butyl acrylate copolymer, itaconic acid / styrene / n-butyl acrylate copolymer, acrylic acid / styrene / methyl acrylate copolymer, methacrylic acid / alpha-methyl styrene copolymer, methacrylic acid / methyl methacrylate / n-propyl acrylate copolymer, acrylic acid / methyl methacrylate / methyl acrylate copolymer, acrylic acid / acrylonitrile / 2-ethylhexyl acrylate copolymer, acrylic acid / styrene / acrylonitrile / n-butyl acrylate copolymer, acrylic acid / styrene / acrylonitrile / ethyl acrylate copolymer, methacrylic acid / styrene / methyl methacrylate / n-butyl acrylate copolymer, methacrylic acid / methyl methacrylate / acrylonitrile / 2-ethylhexyl acrylate copolymer, acrylic acid / methyl methacrylate / acrylonitrile / n-octyl methacrylate copolymer, acrylic acid / styrene / methyl methacrylate / 2-ethylhexyl acrylate, methacrylic acid / styrene / methyl methacrylate / 2-ethylhexyl acrylate copolymer and acrylic acid / styrene / methyl methacrylate / n-butyl acrylate copolymer.

When the degree of polymerization is less than 100, the film-formability of the copolymer diminishes. On the other hand when the degree of polymerization is higher than 1,000, it is difficult to make the copolymer water-soluble and also to remove the protective layer by a weak alkaline solution.

Amounts of the unsaturated carboxylic acid of more than 70 percent by weight reduce the resistance to water and humidity and remarkably decrease the photosensitivity and resolution. When the amount of the unsaturated carboxylic acid is less than 10 percent by weight, the resistance to humidity and water increases too much to develop with a solvent medium containing 50 or more than 50 percent by weight of water or an aqueous weak alkaline solution of pH 7 to pH 9 and spots by development are produced.

When the amount of the ethylenically unsaturated compounds as the soft component is less than 30 percent by weight, the coating of the copolymer over a photosensitive material is reduced in flexibility and cracks occur in the coating and thus the air-impermeability of the coating is lost. On the other hand when the amount is more than 50 percent by weight, the coating of the copolymer becomes tacky and interleaving paper during storage adheres to the coating and also an image-bearing transparency, for example, a negative during exposure adheres to the coating and is soiled by the coating. In order to minimize these drawbacks, up to 40 percent by weight of the ethylenically unsaturated compounds as the hard component are employed.

The copolymers according to this invention may be prepared by copolymerizing the above-described constituents in the conventional solution polymerization method, emulsion polymerization method or suspension polymerization. In this copolymerization reaction peroxides or azo compounds may be employed as the initiators.

Such initiators include, for example, peroxides such as benzoyl peroxide, cumene hydroperoxide, tertiary butyl peroxide, diisopropyl peroxy dicarbonate; and azo compounds such as 2,2'-azo-bis-isobutyronitrile, 2,2'-azo-bis-2,4-dimethyl valeronitrile, 2,2'-azo-bis-2,4-dibutyl valeronitrile and are preferably employed in an amount of from about 1 to 5 percent by weight based on the total weight of the ethylenically unsaturated compounds.

The copolymerization is typically effected at a temperature of from about 50°C. to 120°C. for about 1 to 15 hours.

When the solution polymerization method is employed, examples of suitable reaction medium include ketones such as methylethyl ketone, methylbutyl ketone; esters such as ethyl acetate, butyl acetate, ethers such as ethylene glycol monobutyl ether, dioxane; and alcohols such as 2-propanol, 1-butanol. Among these compounds, alcohols having 3 to 5 carbon atoms such as 1-propanol, 1-butanol, 1-pentanol, the isomers thereof and the mixtures thereof which are compatible with water are preferred.

When a layer of photosensitive material is coated with the copolymer thus obtained in the solution polymerization reaction, the copolymer may be diluted with a solvent. When it is necessary to impart water-solubility to the copolymer, the carboxyl groups of copolymer may be neutralized with an amine or ammonia. Suitable examples of such amines include diethylamine, triethylamine, isopropylamine, ethanolamine, diethanolamine and morpholine. For example, about 0.4 to 1.0 mole, based on the carboxyl groups of the copolymer, of the amine or ammonia is added to the copolymer with stirring to neutralize the carboxyl groups and subsequently water is added thereto to give an aqueous solution containing a desired amount of solids of the copolymer.

The protective layer having a thickness of about 0.5 to 20 microns is applied from the aqueous solution or the organic solvent solution of the copolymer by hand or by a whirler, a roll coater or a curtain coater, and dried. The protective layer is so thin that it cannot be stripped mechanically, unsupported, in one piece from the photosensitive layer. When the thickness of the overcoating is thinner than 0.5 micron, the oxygen-impermeability is insufficient, while when the thickness is thicker than 20 microns, the resolution and developability are reduced.

The protective layer according to this invention is insoluble in water to such an extent as to be sufficiently oxygen-impermeable and insensitive to humidity during storage and exposure. Furthermore, the protective layer can easily be removed by an aqueous alkaline solution or a water-miscible organic solvent containing at least 50 % by volume of water.

Photosensitive materials which may be utilized in this invention include diazo type resins, diazide type resins, bichromate type resins and photocrosslinkable or photopolymerizable type resins. Especially the coating according to the present invention is effective for photopolymerizable type resins disclosed in the copending U.S. Application Ser. No. 208,690, filed Dec. 16, 1971 now U.S. Pat. No. 3,796,578, issued Mar. 12, 1974.

That is a photopolymerizable composition comprising (A) about 100 parts by weight of an addition polymerizable polymeric compound, (B) about 5 to 70 parts by weight of at least one ethylenically unsaturated compound and (C) about 0.0001 to 10 parts by weight of a photopolymerization initiator, said addition polymerizable polymeric compound being obtained by esterification of a copolymer having pendant carboxyl groups with about 0.03 to 1.0 equivalent, based upon the carboxyl groups of said copolymer, of an ethylenically unsaturated compound having one oxirene ring, said copolymer being obtained by copolymerizing (1) about 10 to 95 percent by weight of at least one member selected from the group consisting of styrene and the methyl-substituted styrene derivatives, (2) about 5 to 70 percent by weight of at least one ethylenically unsaturated mono- or dicarboxylic acid, its anhydride or its monester with an alkanol of 1 to 4 carbon atoms, (3) up to about 30 percent by weight of at least one member selected from the group consisting of acrylonitrile and methacrylonitrile, (4) up to about 85 percent by weight of at least one compound of the formula $$CH_2=C(R^1)-\underset{\underset{O}{\|}}{C}-O-R^2$$

wherein $R^1$ represents a hydrogen atom or methyl group; and $R^2$ represents an alkyl group having 1 to 12 carbon atoms, and (5) up to about 50 percent by weight, based upon the total weight of said compound (3) and/or (4), of at least one vinyl ester of a saturated aliphatic mono-carboxylic acid having 2 to 10 carbon atoms.

Examples of suitable methyl-substituted styrenes (1) include alpha-methylstyrene and vinyltoluene.

Examples of suitable ethylenically unsaturated aliphatic monoor di-carboxylic acid, anhydrides or the 1 to 4 carbon atom monoalhyl esters thereof (2) include acrylic acid, methacrylic acid, maleic acid, fumaric acid, crotonic acid, itaconic acid, vinylacetic acid, alpha-ethyl acrylic acid, angelic acid, maleic anhydride, itaconic anhydride, monomethyl malente, itaconate or fumarate, monoethyl maleate, itaconate or fumarate, mono-n-propyl maleate, itaconate or fumarate, mono-isopropyl maleate, itaconate or fumarate and mono-n-butyl maleate, itaconate or fumarate.

Examples of suitable compounds (4) include methyl acrylate or methacrylate, ethyl acrylate or methacrylate, n-propyl acrylate or methacrylate, isopropyl acrylate or methacrylate, butyl acrylate or methacrylate, hexyl acrylate or methacrylate, octyl acrylate or methacrylate, dodecyl acrylate or methacrylate, 2-ethyl hexyl acrylate or methacrylate and lauryl acrylate or methacrylate.

Examples of suitable compounds (5) include vinyl acetate, vinyl propionate, vinyl butyrate, vinyl valerate, vinyl decanoate and vinyl versatate.

Examples of suitable copolymers having pendant carboxyl groups include styrene / acrylic acid copolymer, styrene / acrylic acid / acrylonitrile copolymer, styrene / acrylic acid / acrylonitrile / n-butyl acrylate copolymer, styrene / methacrylic acid copolymer, styrene / acrylic acid / n-butyl acrylate copolymer, styrene / acrylic acid / methacrylonitrile copolymer, styrene / acrylic acid / n-butyl acrylate / vinyl acetate copolymer, styrene / methacrylic acid / acrylonitrile / ethyl acrylate copolymer, styrene / acrylic acid / acrylonitrile / ethyl acrylate copolymer, styrene / acrylic acid / acrylonitrile / methacrylonitrile copolymer, styrene / acrylic acid / acrylonitrile / n-butyl acrylate / methyl acrylate copolymer, styrene / acrylic acid / acrylonitrile / n-octyl acrylate copolymer, styrene / acrylic acid / methyl methacrylate / n-butyl acrylate copolymer, alpha-methyl styrene / acrylic acid copolymer, vinyl toluene / acrylic acid / acrylonitrile copolymer, styrene / itaconic acid / n-butyl acrylate copolymer, styrene / moncethyl maleate / acrylonitrile / n-butyl acrylate copolymer, styrene / methacrylic acid / acrylonitrile / lauryl acrylate copolymer, styrene / acrylic acid / acrylonitrile / methacrylonitrile copolymer, styrene / methacrylic acid / n-butyl acrylate copolymer, styrene / methacrylic acid / methacrylonitrile / ethyl acrylate copolymer, styrene / methacrylic acid / acrylonitrile copolymer, styrene / acrylic acid / acrylonitrile / 2-ethylhexyl acrylate copolymer and styrene / methacrylic acid / acrylonitrile / 2-ethyhexyl acrylate copolymer.

Exemplary ethylenically unsaturated compounds having one oxirane ring include glycidyl acrylate, glycidyl methacrylate, allyl glycidylether, glycidyl alphaethyl acrylate, crotonyl glycidyl ether, glycidyl crotonate, monomethyl or monoethyl itaconate monoglycidyl ester and monomethyl or monoethyl fumarate monoglycidyl ester.

The ethylenically unsaturated compound (B) comprises at least one compound selected from the group consisting of i. a compound selected from the group consisting of:

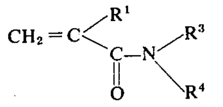

and

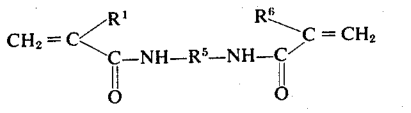

wherein $R^1$ and $R^6$ represent independently a hydrogen atom or methyl group; $R^3$ represents a hydrogen atom or alkyl group having 1 to 4 carbon stoms; $R^4$ represents a hydrogen atom, $-C_mH_{2m+1}$ wherein $m$ is an integer of 1 to 6, Cyclohexyl group, $-(CH_2)_n-CH_3$ wherein $n$ is an integer from 1 to 5, and $-(CH_2)_p-O-C_qH_{2q+1}$ wherein $p$ is an integer from 1 to 2 and $q$ is an integer from 1 to 5 or $-CH_2-CH=CH_2$; $R^5$ represents $-(CH_2)_r-$ wherein $r$ is an integer from 1 to 10; and ii. a compound selected from the group consisting of:

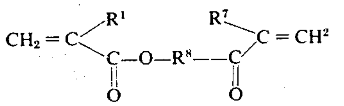

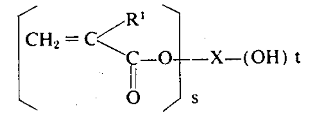

wherein $R^1$ and $R^7$ represent independently a hydrogen atom or methyl group; $R^8$ represents $-(CH_2-CH_2-O)-$ wherein $u$ is an integer from 1 to 15; X represents a radical of a triol or a tetraol; $s$ is an integer from 1 to 4 and $t$ is O or an integer from 1 to 3 and $s + t = 3$ or 4; and iii. a compound selected from the group consisting of:

$$(CH_2=\overset{R^1}{\overset{|}{C}}-COOC_xH_{2x}O)_y\overset{O}{\overset{\|}{P}}(CH_3)_{3-y}$$

wherein $R^1$ represents a hydrogen atom or methyl group; $x$ is an integer from 1 to 5 and $y$ is 1 or 2.

Examples of suitable compounds (i) include acrylamide, methacrylamide, N,N-dimethylacrylamide, N-isopropylacrylamide, N-hexylacrylamide, N-cyclohexylacrylamide, N-methylolacrylamide, N-ethylolacrylamide, N-amyloacrylamide, N-allylacrylamide, N,N'-methylene-bisacrylamide, N,N'-trimethylenebisacrylamide, N,N'-hexamethylenebisacrylamide, N,N'-decamethylenebisacrylamide, N-methoxyethylacrylamide, N-methylmethacrylamide, N-allylmethacrylamide, N-methylolmethacrylamide, N,N'-methylenebismethacrylamide and N-ethoxyethylmethacrylamide.

Examples of suitable compounds (ii) include diethyleneglycol di-acrylate or -methacrylate, triethyleneglycal diacrylate or -methacrylate, tetraethyleneglycol diacrylate or -methacrylate, hexamethyleneglycol diacrylate or -methacrylate, tetradecylethyleneglycol diacrylate or -methacrylate, tetramethylolmethane tetraacrylate or -methacrylate, tetramethylolmethane triacrylate, or -methacrylate, tetramethylolmethane diacrylate or -methacrylate, tetramethylolmethane monoacrylate or -methacrylate, trimethylolmethane tri-acrylate or -methacrylate, trimethylolmethane diacrylate or -methacrylate, trimethylolmethane monoacrylate or -methacrylate.

Examples of suitable compounds (iii) include phosphate of 2-hydroxyethyl methacrylate or acrylate, phosphate of bis (2-hydroxyethyl) methacrylate or acrylate, phosphate of 2-hydroxypropyl methacrylate or acrylate, phosphate of bis (2-hydroxypropyl methacrylate or acrylate), phosphate of 2-hydroxy butyl methacrylate or acrylate, phosphate of bis (2-hydroxybutyl methacrylate or acrylate), phosphate of 2 hydroxyethylpropyl methacrylate or acrylate and phosphate of bis (2-hydroxyethylpropyl methacrylate or acrylate).

Other ethylenically unsaturated compounds (iv) may also be employed as the second component of the photopolymerizable compositions. Examples of such compounds include acrylic acid, alpha-choroacrylic acid, methacrylic acid, methyl methacrylate, methyl alpha-ohloroacrylate, methyl acrylate, ethyl acrylate, n-butyl acrylate, isobutyl acrylate, n-propyl acrylate, isopropyl acrylate, 2-ethyl-hexyl acrylate, n-octyl acrylate, n-decyl acrylate, n-tetradecyl acrylate, allyl acrylate, furfuryl acrylate, glycidyl acrylate, n-butyl methacrylate, isobutyl methacrylate, 2-ethylhexyl methacrylate, lauryl methacrylate, furfuryl methacrylate, 2-hydroxyethyl methacrylate, 2-hydroxypropyl methacrylate, 2-hydroxyhexyl methacrylate, glycidyl methacrylate, styrene, divinylbenzene, alpha-methylstyrene, vinyltoluene, alpha-chlorostyrene, vinylchlorobenzene, vinylphenol, aminostyrene, vinylbenzoic acid, methoxystyrene, allylbenzene, allyltoluene, monoallylphthalate, diallylphthalate, allylalcohol, allylacetate, vinylacetate, vinylpropionate, maleic acid, fumaric acid, itaconic acid, dimethyl maleate, diethyl maleate, dimethyl fumarate, diethyl fumarate, dimethyl itaconate, diethyl itaconate, cinnamic acid, ethylvinylether, propylvinylether, methylvinylketone, acrolein, vinylidene chloride, vinylpyridine, vinylpyrrolidone, diethylvinylamine, vinylcarbazole.

These compounds are preferably used in an amount of from about 5 to 70 parts by weight, more preferably from about 20 to 50 parts by weight based upon 100 parts by weight of addition polymerizable polymeric compound.

Exemplary photopolymerization initiators include alpha-carbonyl alcohols and alpha-carbonyl ethers such as benzoin, alpha-methyl benzoin, alpha-phenyl benzoin, alpha-allyl benzoin, alpha-benzyl benzoin, butyroin, acetoin, benzoin methyl ether, benzoin ethyl ether, pivaloin ethyl ether, anisoin ethyl ether anthraquinones such as anthraquinone, 2-methyl anthraquinone, 2-ethyl anthraquinone, 2-tertiary butyl anthraquinone, 1-chloroanthraquinone, 2-bromoanthraquinone, 2-nitroanthraquinone, anthraquinone-1-aldehyde, anthraquinone-2-thiol, 4-cyclohexyl anthraquinone, 1,4-dimethyl anthraquinone, 1-methoxy anthraquinone, anthraquinone-1-carbonyl chloride benzathraquinone, sulfides such as diphenyl disulfide, tetraethyl thiouram, diketones such as benzil, diacetyl; uranyl salts such as uranyl nitrate, uranyl propionate; and azo compounds such as azo-bis-isobutyronitrile.

These photopolymerization initators are preferably used in an amount of from about 0.0001 to 10 percent by weight of the total weight of the photopolymerizable composition.

Known stabilizers may be employed for the purpose of maintaining storage stability (shelf life) of the photopolymerizable compositions. Such stabilizers may be added when the components of photopolymerizable composition are admixed or may be added to each component separately prior to admixing of the components.

Exemplary stabilizers include hydroquinone, hydroquinone monomethyl ether, hydroquinone monoethyl ether, hydroquinone tertiary butyl ether, benzoquinone, p-methoxy phenol, 2,5-diphenyl-p-benzophenone, pyridine, phenothiazine, p-diamino benzene, beta-naphthol, naphthylamine, pyrogallol, tertiary butyl catechol and nitrobenzene.

These stabilizers are added only for preventing thermal polymerization without the actinic radiation set forth above but without restraining the photopolymerization. Consequently the amount of the stabilizers may be preferably 0.001 to 10 percent by weight of the total weight of the photopolymerizable composition.

Furthermore, various compounds such as fillers and plasticizers may be incorporated into the photopolymerizable compositions in order to improve the mechanical properties after photopolymerization. These compounds include, for example, mica, fine powdery silicon oxides and glass, polyethylenes, polyesters, polyethylene-oxides, polymethylmethacrylates, cellulose and cellulose esters; and dibutylphthalate, diactylphthalate, oligoethyleneglycol monoalkylesters, oligoethyleneglycol dialkylesters and tricresylphosphate.

The solutions of photopolymerizable compositions are obtained by dissolving the above-mentioned components in a solvent. Examples of such solvent medium include esters such as ethyl acetate, butyl acetate, ketones such as methylethyl ketone, alcohols such as 2-propanol, 1-butanol, tertiary butyl alcohol and diacetone alcohol; ethers such as dioxane; aromatic hydrocarbons such as benzene; and the mixtures of these compounds.

The concentration of the solutions depends upon the coating methods and conditions of applying the solutions onto base or support meterials. For example, the concentration of the components of photopholymerizable compositions is preferably about 2 to 20 percent by weight for preparing phtosensitive elements for offset printing by a whirler.

The solutions of photopolymerizable compositions may be coated on a support material by hand or by a whirler, a roll coater, or a curtain coater.

The thickness of a layer of photopolymerizable compositions is preferably in the range of about 0.3 micron to 50 microns when dry.

Examples of suitable support materials include metals such as aluminum, zinc, tin, stainless steel, chromium-copper, bimetal, chromium-copper-aluminum trimetal plates, sheets and foils and plastics such as polyester, polymethylmethacrylate, polyvinylchloride, polyvinylidenechloride, polystyrene films and plates and laminates of a plastic film on a metal foil such as aluminum, and screens such as silk, polyamide, polyester. The thickness of these support materials is preferably in the range of about 0.05 to 0.09 mm., more preferably in the range of about 0.10 mm. to 0.75 mm.

These support materials preferably have a hydrophilic surface at the time the layer of a photopolymerizable composition is applied. The surface may be roughened mechanically, chemically or electrochemically in order to improve retention of aqueous liquids and to improve adhesion of layers of photosensitive materials to be applied thereon.

For example, in the preparation of a lithographic plate, the photopolymerizable element is placed in a vacuum form and exposed at room temperature to a source irradiating actinic radiation through a process transparency, e.g., a negative or positive film. Practical sources of such actinic radiation include carbon arc lamps, mercury lamps, xenon lamps and chemical lamps. After removal of the transparency, the non-image areas are washed out with a solvent liquid such as an aqueous solution or an organic solvent. Exemplary solvent liquids include aqueous solutions of sodium hydroxide, potassium hydroxide, sodium carbonate, sodium bicarbonate, disodium hydrogenphosphate and tri sodium phosphate or mixtures with methanol, ethanol, 2-propanol, acetone or methylethyl ketone; and acetone, methylethyl ketone, ethyl acetate, methyl-isobutyl keton, n-butyl acetate, dioxane and chloroform. A processor with a spray nozzle or a brush may be used but a by-hand washing and a pouring type washing are also possible. Also bi-metal or tri-metal printing plates can be obtained by etching and peeling-off after developing.

SYNTHESIS 1

In a 3 liter four-necked flask equipped with a stirrer, a reflux condenser, a dropping funnel and a thermometer, there were charged 1,000 g. of isopropyl alcohol as a reaction medium and heated at 80°C. while replacing the air with nitrogen gas. To the dropping funnel there was added a mixture of the desired amounts of ethylenically unsaturated compounds set forth in Table 1 and 20 g. of N,N′-azo-bis-isobutyronitrile as a polymerization catalyst, and the mixture was added dropwise in the flask over 2.5 hours and the resulting mixture was heated at 80°C. for 5.5 hours to complete reaction. Each of the copolymers thus obtained had a degree of polymerization set forth in Table 1.

Table 1

| Run No. | Mixture of ethylenically unsaturated compounds (g.) | | Degree of polymerization |
|---|---|---|---|
| 1 | Acrylic acid | 300 | about |
| | Styrene | 400 | 150 |
| | n-Butyl acrylate | 300 | |
| 2 | Methacrylic acid | 300 | about |
| | Alpha-methyl styrene | 300 | 180 |
| | 2-Ethylhexyl acrylate | 400 | |
| 3 | Acrylic acid | 200 | about |
| | Styrene | 200 | 180 |
| | Acrylonitrile | 200 | |
| | n-Butyl acrylate | 400 | |
| 4 | Acrylic acid | 600 | about |
| | Acrylonitrile | 100 | 800 |
| | 2-Ethylhexyl acrylate | 300 | |
| 5 | Acrylic acid | 200 | about |
| | Methyl methacrylate | 400 | 340 |
| | Methyl acrylate | 400 | |
| 6 | Acrylic acid | 400 | about |
| | Styrene | 200 | 250 |
| | Methyl acrylate | 400 | |
| 7 | Acrylic acid | 300 | about |
| | Styrene | 200 | 240 |
| | Acrylonitrile | 100 | |
| | Ethyl acrylate | 400 | |
| 8 | Methacrylic acid | 400 | about |
| | Methyl methacrylate | 200 | 250 |
| | n-Propyl acrylate | 400 | |
| 9 | Methacrylic acid | 300 | about |
| | Styrene | 200 | 350 |
| | Methyl methacrylate | 200 | |
| | n-Butyl acrylate | 300 | |
| 10 | Methacrylic acid | 500 | about |
| | Methyl methacrylate | 100 | 110 |
| | Acrylonitrile | 100 | |
| | 2-Ethylhexyl acrylate | 300 | |
| 11 | Itaconic acid | 200 | about |
| | Styrene | 400 | 270 |
| | n-Butyl acrylate | 400 | |
| 12 | Acrylic acid | 500 | about |
| | Methyl methacrylate | 100 | 200 |
| | Acrylonitrile | 100 | |
| | n-Octyl methacrylate | 300 | |
| 13 | Acrylic acid | 400 | about |
| | Styrene | 150 | 450 |
| | Methyl methacrylate | 150 | |
| | 2-Ethylhexyl acrylate | 300 | |
| 14 | Acrylic acid | 700 | about |
| | n-Butyl acrylate | 300 | 800 |
| Reference 1 | Acrylic acid | 70 | about |
| | Styrene | 400 | 160 |

Table 1-Continued

| Run No. | Mixture of ethylenically unsaturated compounds (g.) | | Degree of polymerization |
|---|---|---|---|
| | n-Butyl acrylate | 530 | |
| 2 | Acrylic acid | 750 | about |
| | Styrene | 50 | 320 |
| | n-Butyl acrylate | 200 | |
| 3 | Methacrylic acid | 200 | about |
| | Styrene | 100 | 480 |
| | Methyl methacrylate | 100 | |
| | n-Butyl acrylate | 600 | |
| 4 | Acrylic acid | 300 | about |
| | Styrene | 200 | 200 |
| | Methyl methacrylate | 300 | |
| | 2-Ethylhexyl acrylate | 200 | |

SYNTHESIS 2

In a 2 liter four-necked flask equipped with a stirrer, a reflux condenser, a dropping funnel and a thermometer, there were charged 500 g. of isopropyl alcohol as a reaction medium and heated at 80°C. while replacing the air in the flask with nitrogen gas. To the dropping funnel there was added a mixture of 350 g. of styrene and 150 g. of acrylic acid and 15 g. of N,N′-azo-bis-isobutyronitrile as a polymerization catalyst and the mixture was added dropwise to the flask over 2.5 hours and the resulting mixture was heated at 80°C. for 5.5 hours to complete the reaction. This reaction mixture was cooled at 60°C., and 480 g. of isopropyl alcohol, 1.5 g. of hydroquinone as a polymerization inhibitor and 18.75 g. of a 40 percent methanol solution of trimethylbenzyl ammonium hydroxide as a catalyst were added thereto. After raising the temperature of the mixture to 80°C., 150 g. of glycidyl methacrylate containing 1.5 g. of hydroquinone were added dropwise thereto over one hour and the reaction was further continued for 4 hours. The resulting copolymer had a viscosity of about 150 centipoise, and the extent of addition of the glycidyl methacrylate to the resulting copolymer based upon the carboxyl groups was 66 percent.

SYNTHESIS 3

The procedure of Synthesis 2 for preparing a copolymer was repeated except that a mixture of ethylenically unsaturated compounds shown below was used and 500 g. of n-butyl alcohol were used as a reaction medium instead of the isopropyl alcohol.

| Mixture of ethylenically unsaturated compounds (g). | |
|---|---|
| Styrene | 300 |
| Acrylonitrile | 25 |
| n-Butyl acrylate | 25 |
| Acrylic acid | 150 |

Then the addition reaction of glycidyl methacrylate to the carboxyl groups of the resulting copolymer was carried out as in Synthesis 2 except that 480 g. of n-butyl alcohol were used instead of the isopropyl alcohol. The resulting copolymer had a viscosity of about 70 centipoise and the extent of addition of the glycidyl methacrylate to the resulting copolymer based upon the carboxyl groups was 68 percent.

SYNTHESIS 4

The procedure of Synthesis 2 for preparing a copolymer was repeated except that the following mixture of ethylenically unsaturated compounds was used.

| Mixture of ethylenically unsaturated compounds | (g.) |
|---|---|
| Acrylonitrile | 175 |
| n-Butyl acrylate | 200 |
| Acrylic acid | 125 |

Then the reaction mixture thus obtained was allowed to react with 100 g. of glycidyl methacrylate as in Synthesis 2. The resulting copolymer had a viscosity of about 90 centipoise and the extent of addition of the glycidyl methacrylate to the resulting copolymer based on the carboxyl groups was 65 percent.

EXAMPLE 1

100 g. of the polymer obtained in Synthesis 2 were dissolved in a mixture of 900 ml. of ethyl acetate and 300 g. of 2-ethoxyethanol. Then, to the resulting mixture there were added 30 g. of tetramethylolmethane teramethacrylate, 20 g. of triethyleneglycol dimethacrylate and 0.9 g. of 1,2-benzanthraquinone, and the mixture thus obtained was thoroughly mixed to give a photosensitive solution. A turbo-grained aluminum plate, 0.2 mm. thick, was coated with the photosensitive solution by a whirler at a rotating rate of 80 r.p.m. and dried at 90°C. for 4 minutes. The thickness of the photosensitive layer was 3 microns.

Separately 100 g. of each of the copolymers obtained in Synthesis 1, Runs 1 to 14 were neutralized and made water-soluble with triethylamine in an amount set forth in Table 2, and then water was added thereto to produce an aqueous solution containing 5% solids of the copolymer.

Table 2

| Copolymer (Run No.) | Amount of triethylamine (g.) |
|---|---|
| 1 | 33 |
| 2 | 28 |
| 3 | 22 |
| 4 | 67 |
| 5 | 22 |
| 6 | 44 |
| 7 | 33 |
| 8 | 37 |
| 9 | 28 |
| 10 | 47 |
| 11 | 25 |
| 12 | 55 |
| 13 | 44 |
| 14 | 78 |

Then the photosensitive layer was overcoated with each resulting aqueous solution by a whirler at a rotating rate of 80 r.p.m. and dried at 90°C. for 5 hours. The thickness of the protective layer was 1 micron. The protective layer became water-insoluble, and moisture- and air-impermeable. When the resulting plate was kept at 30°C. in a relative humidity of 80% for 10 days, the performance of the surface of the plate did not change. Then this plate was placed in a vacuum frame and exposed to a high pressure mercury lamp under a pressure of 400 mmHg at a distance of 1 m. for 1 minute through a negative. After washing off the unexposed portions with a 1% trisodium phosphate solution, the plate was subjected to washing with water to give a lithographic plate for offset printing having clear and precise image areas without scumming. The printing plate had excellent inking, resolution and durability.

REFERENCE EXAMPLE 1

100 g. of the copolymer obtained in Synthesis 1, Reference 1 were made water-soluble with 7.8 g. of triethylamine, and thereto water was added to produce a solution containing 7% solids of the copolymer. Since the copolymer was not sufficiently water-soluble and the solution was turbid, such an aqueous solution was incapable of forming a film. Accordingly, to this polymer solution there was added isopropyl alcohol to give a solution containing 10% solids of the copolymer.

On the other hand, a turbo-grained aluminum plate, 0.2 mm. thick, was coated with p-diazodiphenylamine-paraformamide condensate and the thickness of the photosensitive layer was 3 microns. Then the photosensitive layer was overcoated with the solution of the copolymer and dried as in Example 1. The thickness of the protective layer was 3 microns. It was difficult to develop, after exposure through a negative, the plate with a 1% trisodium phosphate aqueous solution and to sufficiently remove the protective layer.

REFERENCE EXAMPLE 2

100 g. of the copolymer obtained in Synthesis 1, Reference 2 were neutralized with 89.8 g. of triethanolamine, and thereto water was added to produce an aqueous solution containing 5% solids of the copolymer.

The same aluminum plate as in Example 1 was coated with the copolymer obtained in Synthesis 3 in the same manner as in Example 1. The thickness of the photosensitive layer was 4 microns. Then the photosensitive layer was overcoated with the aqueous solution of the copolymer and the thickness of the protective layer was 0.1 microns. This protective overcoating was poor in resistance to humidity, and when the plate was kept at 30°C. in a relative humidity of 80% for 3 days and, after exposure through a negative, developed in the same manner as in Example 1, scumming occurred, and clear and precise prints could not be obtained.

REFERENCE EXAMPLE 3

100 g. of the copolymer obtained in synthesis 1, Reference 3 were neutralized with 7.2 g. of ethanolamine, and thereto water was added to proruce an aqueous solution containing 10% solids of the copolymer. The same photosensitive layer as in Example 1 was coated with the aqueous solution and dried as in Example 1. The thickness of the protective layer was 4 microns. The protective layer was tacky and when the paper was placed on the plate, a mark of the paper was left on the overcoating. Furthermore, a negative placed on the plate during exposure left its mark and the resulting plate could not be used as a printing plate.

REFERENCE EXAMPLE 4

100 g. of the copolymer obtained in Synthesis 1, Reference 4 were neutralized with 16.9 g. of triethylamine, and thereto water was added to produce an aqueous solution containing 20% solids of the copolymer. The same photosensitive layer as in Example 1 was coated with the aqueous solution using a roll coater and dried. The thickness of the protective layer was 6 microns. The protective layer was hard and poor in flexibility and cracks occurred in the protective layer when kept at 30°C. in a relative humidity of 60% for 3 days.

REFERENCE EXAMPLE 5

100 g. of the copolymer obtained in Synthesis 1, Run 1 were neutralized with 33.7 g. of triethylamine, and thereto water was added to produce an aqueous solution containing 1% solid of the copolymer. The same photosensitive layer as in Example 1 was coated with the aqueous solution and dried in the same manner as in Example 1. The thickness of the protective layer was 0.3 microns.

When the resulting plate was kept at 30°C. in a relative humidity of 80% for 2 days and developed after exposure through a negative, as in Example 1, scumming occurred and images did not form completely.

REFERENCE EXAMPLE 6

100 g. of the copolymer obtained in Synthesis 1, Run 1 were neutralized with 23.3 g. of diethanolamine, and thereto water was added to produce an aqueous solution containing 40% solid of the copolymer. The same photosensitive layer as in Example 1 was coated with the aqueous solution using a roll coater and dried. The thickness of the protective layer was 30 microns.

When the plate was, after exposure through a negative, developed as in Example 1, it was difficult to sufficiently remove the protective overcoating. Also the resolving power was reduced and a good printing plate was not produced.

EXAMPLE 2

100 g. of the copolymer obtained in Synthesis 3 were dissolved in 600 g. of 2-ethoxyethanol and to the solution there were added 30 g. of acrylamide, 20 g. of tetraethyleneglycol diacrylate and 1 g. of 4,4'-bis-dimethyl-aminobenzophenone, and the resulting mixture was thoroughly mixed to obtain a photosensitive solution. The same support as in Example 1 was coated with the resulting photosensitive solution in the same manner as in Example 1 and the thickness of the photosensitive layer was 4 microns.

100 g. of each of the copolymers obtained in Synthesis 1, Run 3 were neutralized with 23.3 g. of diethanolamine, and then water was added thereto to produce an aqueous solution containing 5% solids of the copolymer.

The photosensitive layer was coated with each resulting aqueous solution in the same manner as in Example 1 and the thickness of the protective layer was 3 microns. With testing as in Example 1, equivalent results were obtained.

EXAMPLE 3

100 g. of the copolymer obtained in Synthesis 1, Run 4 were added with a 1 : 1 mixture of isopropyl alcohol/ethanol to produce a solution containing 10% solids of the copolymer.

The same aluminum support as in Example 1 was coated with naphthoquinone-1, 2-diazide-5-sulfanilide, and the thickness of the photosensitive layer was 1 to 2 microns. Then the photosensitive layer was overcoated with the solution of the copolymer and dried in the same manner as in Example 1. The thickness of the overcoating was 2 microns and a water drop fallen on the overcoating did not leave its mark. The plate, after storage under the same conditions as in Example 1, gave results comparable with those of Example 1 when used to make a printing plate.

REFERENCE EXAMPLE 7

50 g. of polyvinyl alcohol having a degree of polymerization of 500 and a saponification value of 88 and 0.1 g. of a surfactant (alkylester sulfonate of an organic dicarboxylic acid) were dissolved in 1,000 ml. of water. With the resulting solution the same photosensitive layer as in Example 3 was overcoated in the same manner as in Example 3 and the thickness of the overcoating was 1 microns. When the plate thus obtained was kept at 30°C. in a relative humidity of 80% for 2 days, the performance of the surface of the plate was deteriorated and the protective layer was affected by moisture and did not form images sufficiently.

EXAMPLE 4

100 g. of the copolymer contained in Synthesis 4, 50 g. of triethyleneglycol diacrylate, 20 g. of acrylamide and 0.5 g. of 2-ethylanthraquinone were dissolved in 700 ml. of ethanol to produce a photosensitive solution.

A polyester sheer cloth of 250 Tyler mesh was coated with the photosensitive solution and the thickness of the photosensitive layer was 10 microns.

The copolymer obtained in Synthesis 1, Run 1 was made water-soluble as in Example 1 to produce an aqueous solution containing 10% solids of the copolymer. To the resulting aqueous solution the polyester sheer cloth provided with the photosensitive layer was dipped to produce a protective layer of 2 microns. The cloth thus obtained was not affected by moisture and formed images at atmospheric pressure when exposed to actinic light of from 340 to 360 m$\mu$. through a negative. Using the developed cloth for screen printing, excellent prints were produced.

It will be appreciated that the instant specification and examples are set forth by way of illustration and not limitation, and that various modifications and changes may be made without departing from the spirit and scope of the present invention.

What is claimed is:

1. A photosensitive element comprising, in order, 1. a support,
2. a layer of a photopolymerizable composition comprising
   - a. about 100 parts by weight of an addition polymerizable polymeric compound obtained by esterification reaction of a copolymer having pendent carboxyl groups with about 0.03 to 1.0 equivalent, based upon the carboxyl groups of said copolymer, of an ethylenically unsaturated compound having one oxirane ring,
   - b. about 5 to 70 parts by weight of at least one ethylenically unsaturated compound and
   - c. about 0.0001 to 10 parts by weight of a photopolymerization initiator, said copolymer being obtained by copolymerizing
     - i. about 10 to 95 percent by weight of at least one member selected from the group consisting of styrene and the methyl-substituted styrene derivatives, ii. about 5 to 70 percent by weight of at least one ethylenically unsaturated mono- or dicarboxylic acid, its anhydride or its monoester with an alkanol of 1 to 4 carbon atoms, iii. up to about 30 percent by weight of at least one member selected from the group consisting of acrylonitrile and methacrylonitrile, iv. up to about 85 percent by weight of at least one compound of the formula

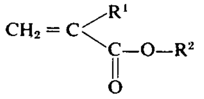

wherein $R^1$ represents a hydrogen atom or methyl group; and $R^2$ represents an alkyl group having 1 to 12 carbon atoms, v. up to about 50 percent by weight, based upon the total weight of said compounds (iii) and (iv), of at least one vinyl ester of a saturated aliphatic monocarboxylic acid having 2 to 10 carbon atoms, and 3. a protective layer having a thickness of about 0.5 to 20 microns, said protective layer being transparent to actinic radiation, substantially impermeable to oxygen, insoluble in water, non-strippable as an unsupported film and composed of a copolymer having a degree of polymerization of about 100 to 1,000 and being obtained by reaction between a. about 10 to 70 percent by weight of an unsaturated carboxylic acid selected from the group consisting of acrylic acid, methacrylic acid and itaconic acid and b. at least one ethylenically unsaturated compound comprising (i) up to about 40 percent by weight of at least one ethylenically unsaturated compound, as a hard component, selected from the group consisting of styrene, alpha-methylstyrene, methyl methacrylate, acrylonitrile and methacrylonitrile and (ii) about 50 to 30 percent by weight of at least one ethylenically unsaturated compound, as a soft component, selected from the group consisting of methyl acrylate, ethyl acrylate, n-propyl acrylate, n-butyl acrylate, 2-ethylhexyl acrylate and n-octyl methacrylate, said protective layer being applied from an aqueous solution obtained by neutralizing said copolymer with about 0.4 to 1.0 mole, per mole of the carboxyl groups of said copolymer, of a member selected from the group consisting of diethylamine, triethylamine, isopropylamine, ethanolamine, diethanolamine, morpholine and ammonia.

2. An element according to claim 1 wherein said copolymer of 3 is a methacrylic acid / styrene / methyl methacrylate / n-butyl acrylate copolymer.

3. An element according to claim 1 wherein said copolymer of 3 is an acrylic acid / styrene / methyl methacrylate / 2-ethylhexyl copolymer.

4. An element according to claim 1 wherein said support is a metal.

5. An element according to claim 4 wherein said metal is aluminum.

6. An element according to claim 1 wherein said copolymer of 2 (a) is a styrene / acrylic acid copolymer.

7. An element according to claim 1 wherein said copolymer of 2 (a) is a styrene / acrylic acid / acrylonitrile / n-butyl acrylate copolymer.

8. An element according to claim 1 wherein said ethylenically unsaturated compound having one oxirane ring of 2 (a) is glycidyl methacrylate.

9. An element according to claim 1 wherein said ethylenically unsaturated compound 2 (b) in the polymerizable composition comprises at least one compound selected from the group consisting of:

i. a compound selected from the group consisting of:

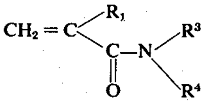

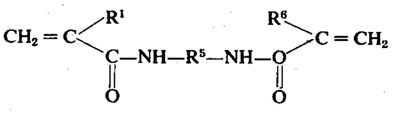

wherein $R^1$ and $R^6$ represent independently a hydrogen atom or methyl group; $R^3$ represents a hydrogen atom or alkyl group having 1 to 4 carbon atoms; $R^4$ represents a hydrogen atom, $—C_mH_{2m+1}$ wherein $m$ is an integer from 1 to 6, cyclohexyl group, $—(CH_2)_n—CH_3$ wherein $n$ is an integer from 1 to 5, $—(CH_2)_p—O—C_qH_{2q+1}$ wherein $p$ is 1 or 2 and $q$ is an integer from 1 to 5 or $—CH_2—CH{=}CH_2$; $R^5$ represents $—(CH_2)_r—$ wherein $r$ is an integer from 1 to 10; and ii. a compound selected from the group consisting of:

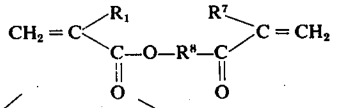

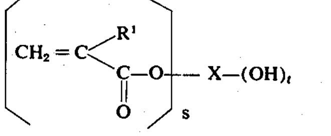

wherein $R^1$ and $R^7$ represent independently a hydrogen atom or methyl group; $R^8$ represents $—(CH_2—CH_2—O)_u—$ wherein $u$ is an integer from 1 to 15; X represents a radical of a triol or a tetraol; $s$ is an integer from 1 to 4 and $t$ is 0 or an integer from 1 to 3 and $s + t = 3$ or 4; and iii. a compound selected from the group consisting of:

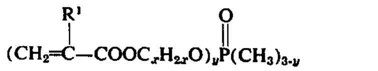

wherein $R^1$ represents a hydrogen atom or methyl group; x is an integer from 1 to 5 and y is 1 or 2.

* * * * *